(12) United States Patent
Wu et al.

(10) Patent No.: US 7,524,592 B2
(45) Date of Patent: Apr. 28, 2009

(54) OPTICAL PROXIMITY CORRECTION MASK AND METHOD OF FABRICATING COLOR FILTER

(75) Inventors: Hsin-Ping Wu, Yilan (TW); Chia-Huei Lin, Shulin (TW)

(73) Assignee: United Microelectronics Corp., Hsinchu (TW)

( * ) Notice: Subject to any disclaimer, the term of this patent is extended or adjusted under 35 U.S.C. 154(b) by 643 days.

(21) Appl. No.: 11/223,339

(22) Filed: Sep. 9, 2005

(65) Prior Publication Data

US 2007/0059609 A1 Mar. 15, 2007

(51) Int. Cl.
*G02B 5/20* (2006.01)
*G03F 1/00* (2006.01)

(52) U.S. Cl. .............................................. 430/5; 430/7

(58) Field of Classification Search ....................... None
See application file for complete search history.

(56) References Cited

U.S. PATENT DOCUMENTS

2005/0284393 A1* 12/2005 Chen et al. .................. 119/211

* cited by examiner

*Primary Examiner*—John A. McPherson
(74) *Attorney, Agent, or Firm*—J.C. Patents (57) ABSTRACT

An optical proximity correction mask used for fabricating a color filter includes a substrate, a mask pattern and a mending pattern. Wherein, the mask pattern is disposed on the substrate. The mask pattern and the transferred pattern, being transferred to the color filter, are not matched and cause occurrence of a light leaking region in the color filter. The mending pattern is disposed over the substrate around the periphery of the mask pattern and corresponds to the light leaking region.

12 Claims, 8 Drawing Sheets

OPTICAL PROXIMITY CORRECTION MASK AND METHOD OF FABRICATING COLOR FILTER

BACKGROUND OF THE INVENTION

1. Field of Invention

The present invention relates to an optical proximity correction mask. More particularly, the present invention relates to an optical proximity correction mask used in fabricating color filter.

2. Description of Related Art

In accordance with the computer performance being greatly improved as well as the network and the multimedia technology being greatly developed, most of the current image information has been converted from analogue to digital and then is transmitted. In order to associate with the modem life, size of the video or the image device has been greatly reduced to be thin and light. The conventional cathode-ray tube (CRT) display has its advantages but this display occupies a large space due to the structure of the internal electron cavity. For the additional issue, it has the radiation during operation, causing damage on eye. Thus, the flat panel display has been developed, based on the optoelectronics technology and the semiconductor fabrication technology. The flat panel display includes, for example, liquid crystal display (LCD), organic light emitting diode (OLED) display, or plasma display panel (PDP), which have been the mainstream of the display products.

Currently, the LCD has been developed in a direction with full color, large size, high resolution, and low fabrication cost. Wherein, the LCD usually uses a color filter to achieve the effect of displaying color. The color filter is usually implemented on a transparent glass substrate. This transparent glass substrate is basically disposed with the black matrix (BM) for shielding the light and the color filtering units with respect to the array of the sub-pixels, such as red color filtering unit, green color filtering unit, and blue filtering unit.

Figure 1:
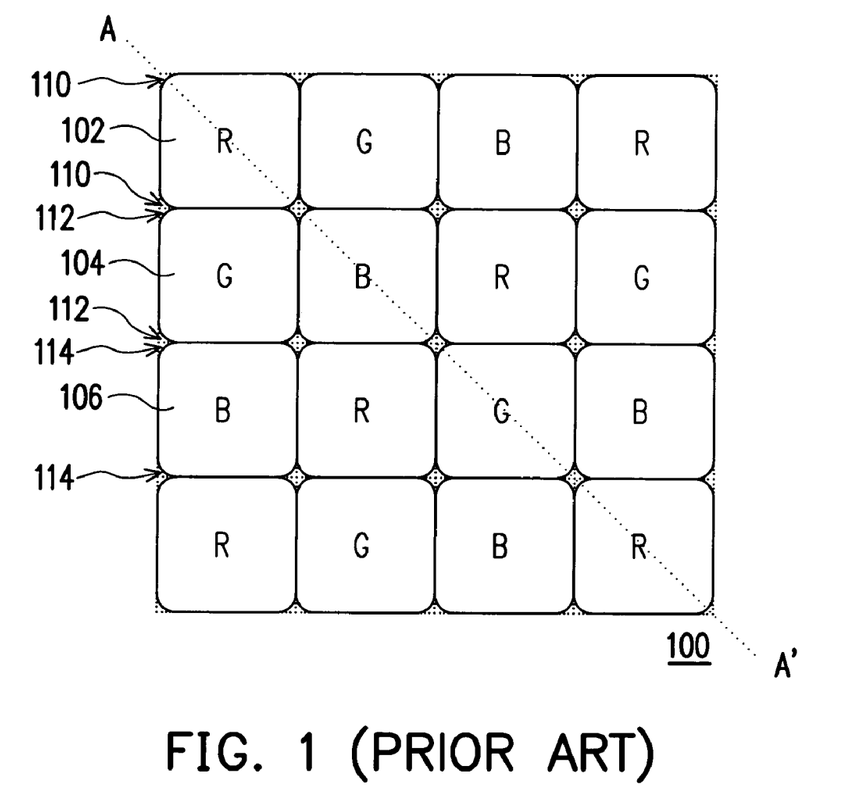
FIG. 1 is a top view, schematically illustrating a conventional color filter.
Figure 2:
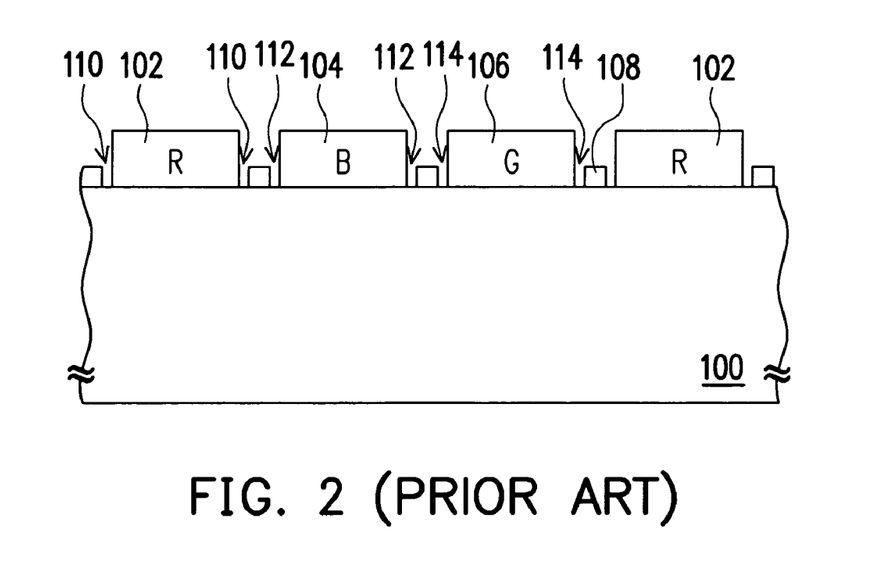
FIG. 2 is a cross-sectional view along the line A-A' in FIG. 1.

FIG. 1 is a top view, schematically illustrating the conventional color filtering plate. FIG. 2 is a cross-sectional view, schematically illustrating the structure along the line A-A'. Referring to FIG. 1 and FIG. 2, the red color filtering unit 102 indicated by R, the green color filtering unit 104 indicated by G, and the blue color filtering unit 106 indicated by B are disposed on the substrate 100 by a mosaic arrangement, and the black matrix 108 is used to separate each of the color filtering units. However, it can be seen that due to affecting of the optical proximity effect, the formation for the red color filtering unit 102, the green color filtering unit 104, and the blue color filtering unit 106 may cause a rounding corner, and it further cause a light leaking regions 110, 112, and 114.

The foregoing light leaking regions 110, 112, and 114 would cause occurrence of leaking light. In a pixel with large size by 4 microns, the leaking light phenomenon occurring at the light leaking regions 110, 112, and 114 may be not causing severe effect. However, when the pixel size is reduced, the leaking light phenomenon occurring at the light leaking regions 110, 112, and 114 would severely affect the color displaying of red, green and blue.

SUMMARY OF THE INVENTION

The invention provides an optical proximity correction mask, capable of reducing the optical proximity effect.

The invention provides a method for fabricating a color filter, capable of solving the light leaking issue at the light leaking region.

The invention provides an optical proximity correction mask, suitable for use to fabricate a color filter having a transferred pattern. The mask includes a substrate, a mask pattern, and a mending pattern. Wherein, the mask pattern is disposed on the substrate. The mask pattern and the transferred pattern, being transferred to the color filter, are not matched and cause occurrence of a light leaking region in the color filter. The mending pattern is disposed on a location corresponding to the light leaking region.

According to an embodiment of the invention, in the foregoing optical proximity correction mask, the mending pattern includes a serif over the side corner of the mask pattern, at a peripheral region of the mask pattern on the substrate.

According to an embodiment of the invention, in the foregoing optical proximity correction mask, the mending pattern includes an internal assisted line disposed within the mask pattern, at a peripheral region of the mask pattern on the substrate.

According to an embodiment of the invention, in the foregoing optical proximity correction mask, the mask pattern includes a rectangular shape.

According to an embodiment of the invention, in the foregoing optical proximity correction mask, the substrate includes transparent glass.

The invention provides a method for fabricating a color filter, suitable for use at a displaying region of a substrate. First, a first-color photoresist layer is coated over the substrate, and a first mask is used to perform a first exposure process on the photoresist. Wherein, the first mask includes a first substrate, a first mask pattern and a first mending pattern. Wherein, the first mask pattern is disposed on the first substrate. The first mask pattern and a first transferred pattern, being transferred to the first-color photoresist, are not matched and cause occurrence of a first light leaking region in the color filter. The mending pattern is disposed over the first substrate around the periphery of the first mask pattern and corresponds to the first light leaking region. A first developing process is performed on the first-color photoresist to form a number of first-color filtering units. Then, a second-color photoresist layer is coated over the substrate, and a second mask is used to perform a second exposure process on the photoresist. Wherein, the second mask includes a second substrate, a second mask pattern and a second mending pattern. Wherein, the second mask pattern is disposed on the second substrate. The second mask pattern and a second transferred pattern, being transferred to the second-color photoresist, are not matched and cause occurrence of a second light leaking region in the color filter. Then, a second developing process is performed on the second-color photoresist to form a number of second-color filtering units. A third-color photoresist layer is coated over the substrate, and a third mask is used to perform a third exposure process on the photoresist. Wherein, the third mask includes a third substrate, a third mask pattern and a third mending pattern. Wherein, the third mask pattern is disposed on the third substrate. The third mask pattern and a third transferred pattern, being transferred to the third-color photoresist, are not matched and cause occurrence of a third light leaking region in the color filter. Then, a third developing process is performed on the third-color photoresist to form a number of third-color filtering units.

According to an embodiment of the invention, in the foregoing method for fabricating a color filter, the first, second, and third mending patterns respectively include a serif over a side corner of each of the first, second, and third mask patterns.

According to an embodiment of the invention, in the foregoing method for fabricating a color filter, the first, second, and third mending patterns include internal assisted lines respectively disposed within the first, second, and third mask patterns.

According to an embodiment of the invention, in the foregoing method for fabricating a color filter, the first mask, the second mask, and the third mask comprise rectangular shape.

According to an embodiment of the invention, in the foregoing method for fabricating a color filter, the first-color filtering units, the second-color filtering units, and the third-color filtering units are arranged by a way of mosaic, stripe, four-pixel arrangement, or triangle.

According to an embodiment of the invention, in the foregoing method for fabricating a color filter, the first-color filtering units, the second-color filtering units, and the third-color filtering units are respectively a red photoresist, a green photoresist, and a blue photoresist, which are in different color to each other.

According to an embodiment of the invention, in the foregoing method for fabricating a color filter, the red photoresist, a green photoresist, and a blue photoresist are negative photoresist.

According to an embodiment of the invention, in the foregoing method for fabricating a color filter, before coating the first-color photoresist, the method further includes forming a black matrix over the substrate.

According to an embodiment of the invention, in the foregoing method for fabricating a color filter, the substrate includes a substrate with thin film transistor (TFT) array.

According to an embodiment of the invention, in the foregoing method for fabricating a color filter, a material for the substrate includes transparent glass.

According to an embodiment of the invention, in the foregoing method for fabricating a color filter, materials for the first substrate, the second substrate, and the third substrate include transparent glass.

In foregoing descriptions about the optical proximity correction mask of the invention, since the optical proximity correction is performed on the mask pattern, the optical proximity effect can be reduced during fabricating the color filter.

In another aspect, in the method for fabricating the color filter, since the mask patent is precisely transferred to the color photoresist, the light leaking region does not exist between the color filtering units of the color filter. Thus, the light leaking phenomenon can be effectively reduced.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 3:
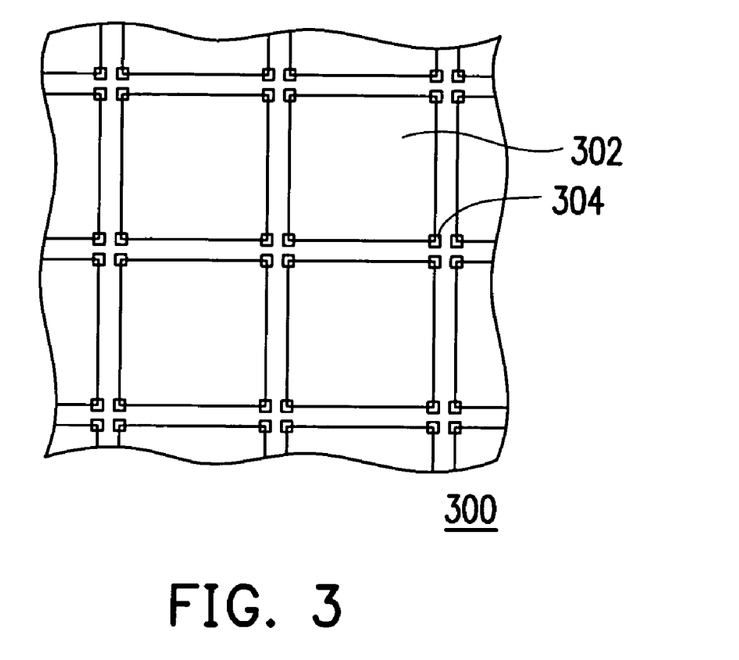
FIG. 3 is a drawing, schematically illustrating an optical proximity correction mask, according to an embodiment of the invention.
Figure 4:
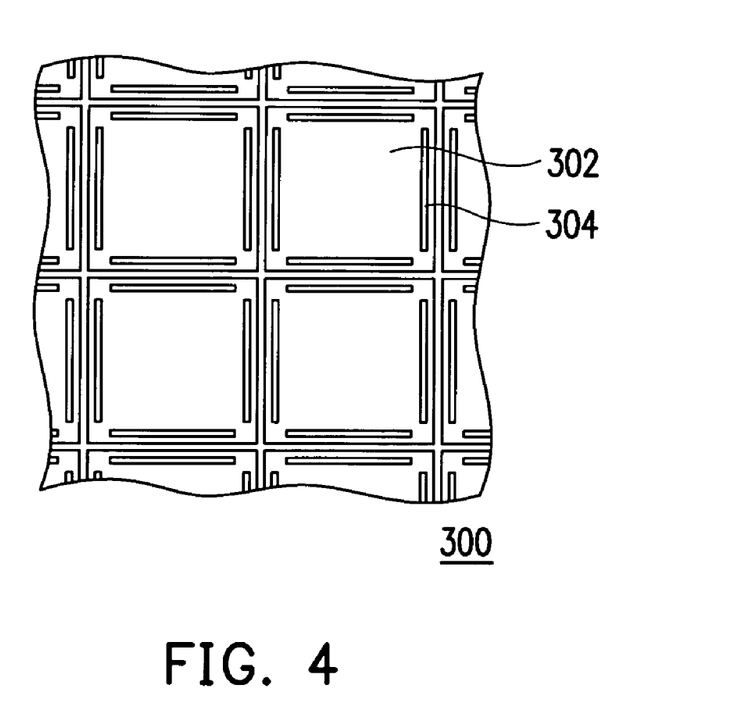
FIG. 4 is a drawing, schematically illustrating an optical proximity correction mask, according to another embodiment of the invention.
Figure 5:
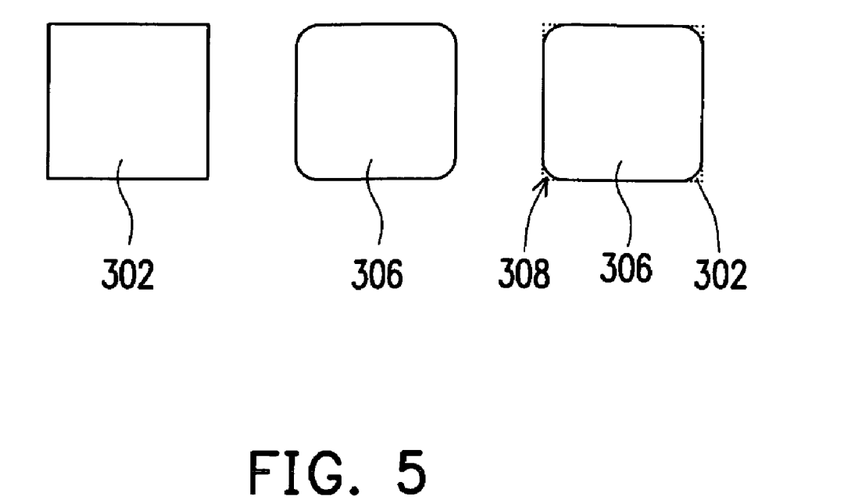
FIG. 5 is a drawing, schematically illustrating the mask pattern and the transferred pattern, according to another embodiment of the invention.

FIG. 3 is a drawing, schematically illustrating an optical proximity correction mask, according to an embodiment of the invention. FIG. 4 is a drawing, schematically illustrating an optical proximity correction mask, according to another embodiment of the invention. FIG. 5 is a drawing, schematically illustrating the mask pattern and the transferred pattern, according to another embodiment of the invention.

Referring to FIG. 3 and FIG. 4, the invention provides an optical proximity correction mask, suitable for fabricating a color filter. The color filter has a transferred pattern, which is indicated by 306 in FIG. 5 and is transferred from the mask pattern, such as the elements indicated by 304 in FIG. 3 and FIG. 4. The optical proximity correction mask includes a substrate 300, a mask pattern 302, and a mending pattern 304. Wherein, the mask pattern 302 and the mending pattern 304 are disposed on the substrate 300. A material for the substrate 300 is, for example, transparent glass.

Then, referring to FIG. 5, the mask pattern 302 and a the transferred pattern 306, which has been transferred to the color filter (not shown in FIG. 5), are not matched and cause occurrence of a light leaking region 308 in the color filter. A shape of the mask pattern 302 can be, for example, rectangular. However, it is not the only choice.

Still referring to FIG. 3 and FIG. 4, the mending pattern 304 can be, for example, a serif located on the side corner of the mask pattern 302 in FIG. 3, or an internal assisted line disposed within the mask pattern as shown in FIG. 4. The positions of the mending patterns 304 is, for example, corresponding to the light leaking region 308 (see FIG. 5). The size of the mask pattern 302 and the mending pattern 304 and the number of the mending pattern 304 can be adjusted in accordance with the desired pattern, and this should be known by the ordinary skilled artisans without further descriptions.

Accordingly, since the optical proximity correction is performed on the mask pattern 302 by adding the mending pattern 304 to the mask pattern 302, the optical proximity effect can be effectively reduced. This is very helpful for precisely transferring the patter in the photolithographic process.

Then, a method in more detail is provided to describe how to use the optical proximity correction mask to fabricate a color filter, suitable for use on a display region of the substrate.

Figure 6:
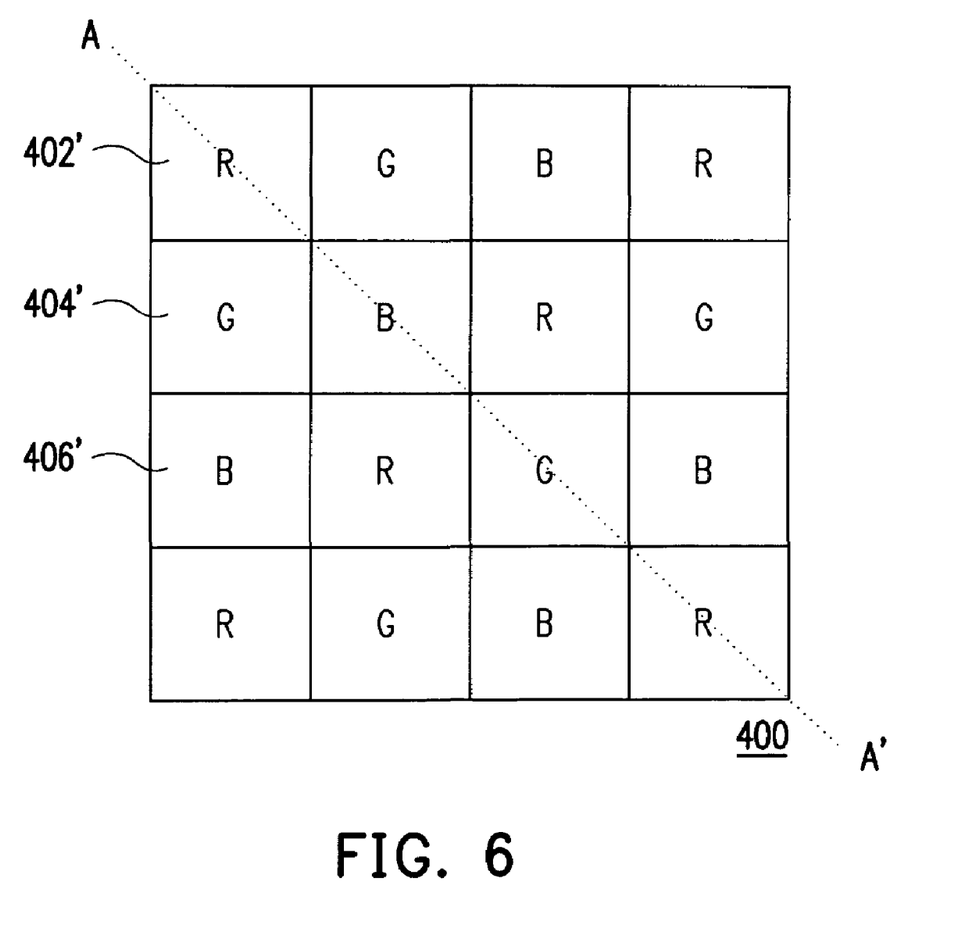
FIG. 6 is a top view, schematically a color filter, according to another embodiment of the invention.

FIG. 6 is a top view, schematically a color filter, according to another embodiment of the invention.

Referring to FIG. 6, the color filtering unit 402' (i.e. red indicated by R), the color filtering unit 404' (i.e. green indicated by G), and the color filtering unit 406' (i.e. blue indicated by B) are for example disposed on the substrate 400 by a mosaic manner. Wherein, the substrate 400 is, for example, a substrate with TFT array or a glass substrate.

However, it can be seen that the color filtering unit 402', the color filtering unit 404', and the color filtering unit 406' do not have the round corner, so that it does not occur about the light leaking phenomenon caused by light leaking region. In the embodiment, even though the color filter is implemented by the mosaic manner, it should be understood by the ordinary skilled artisans that the invention can use other arrangement manner in the method for fabricating color filter. For example, it can be strip type, four-pixel arrangement type, or triangle type.

Figure 8:
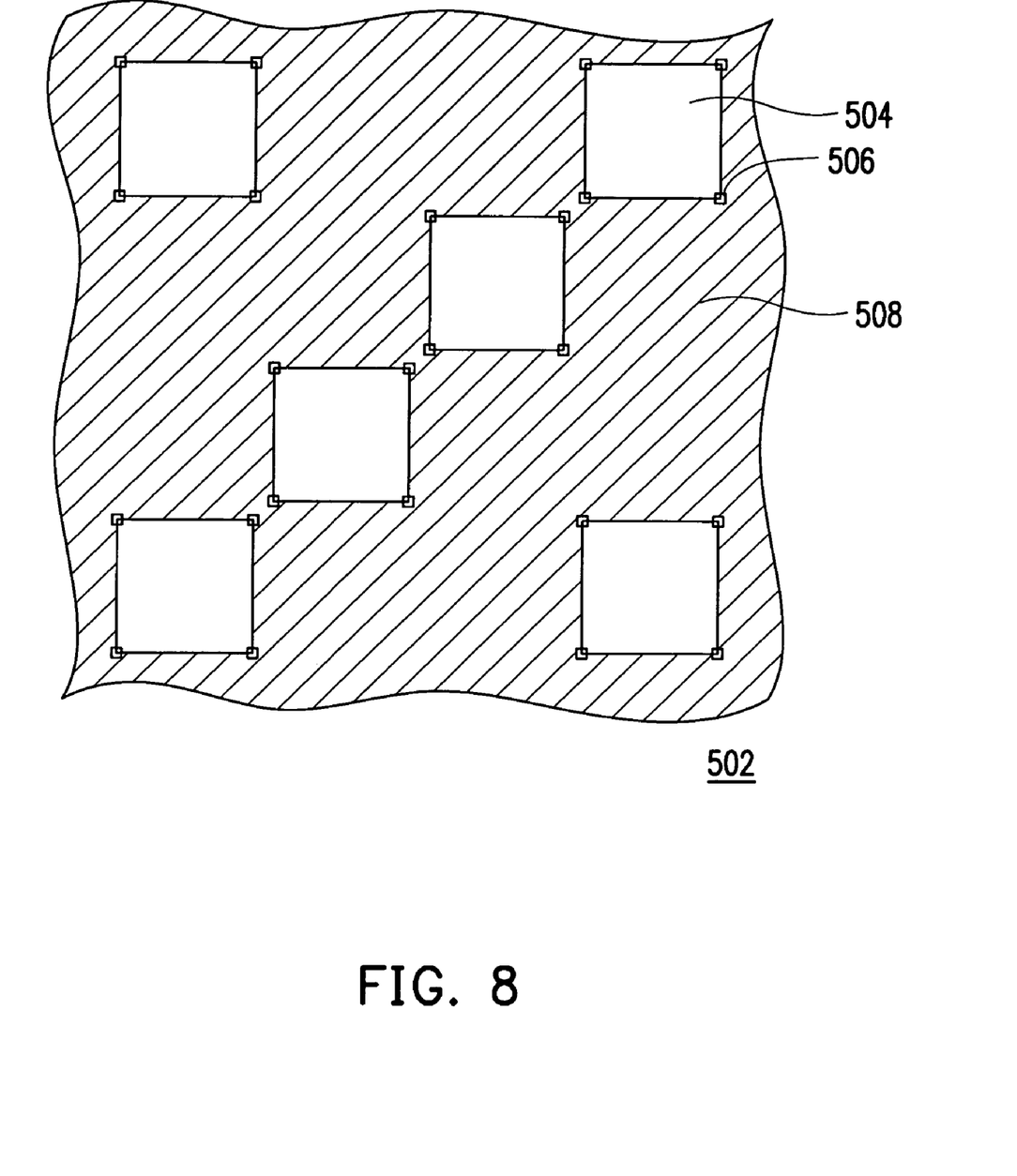
FIGS. 8-10 are top views, schematically illustrating the mask, according to an embodiment of the invention.
Figure 9:
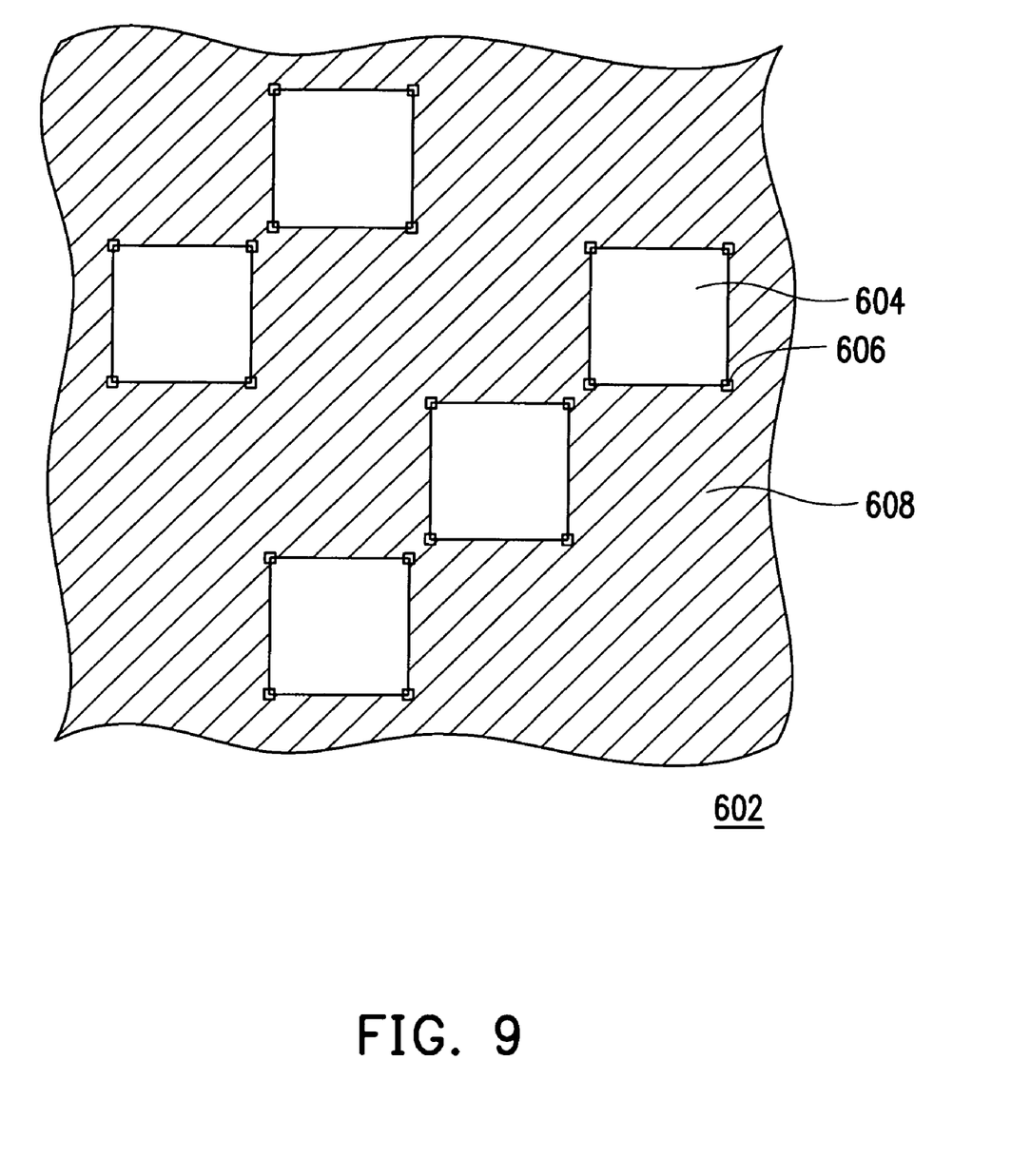
Figure 10:
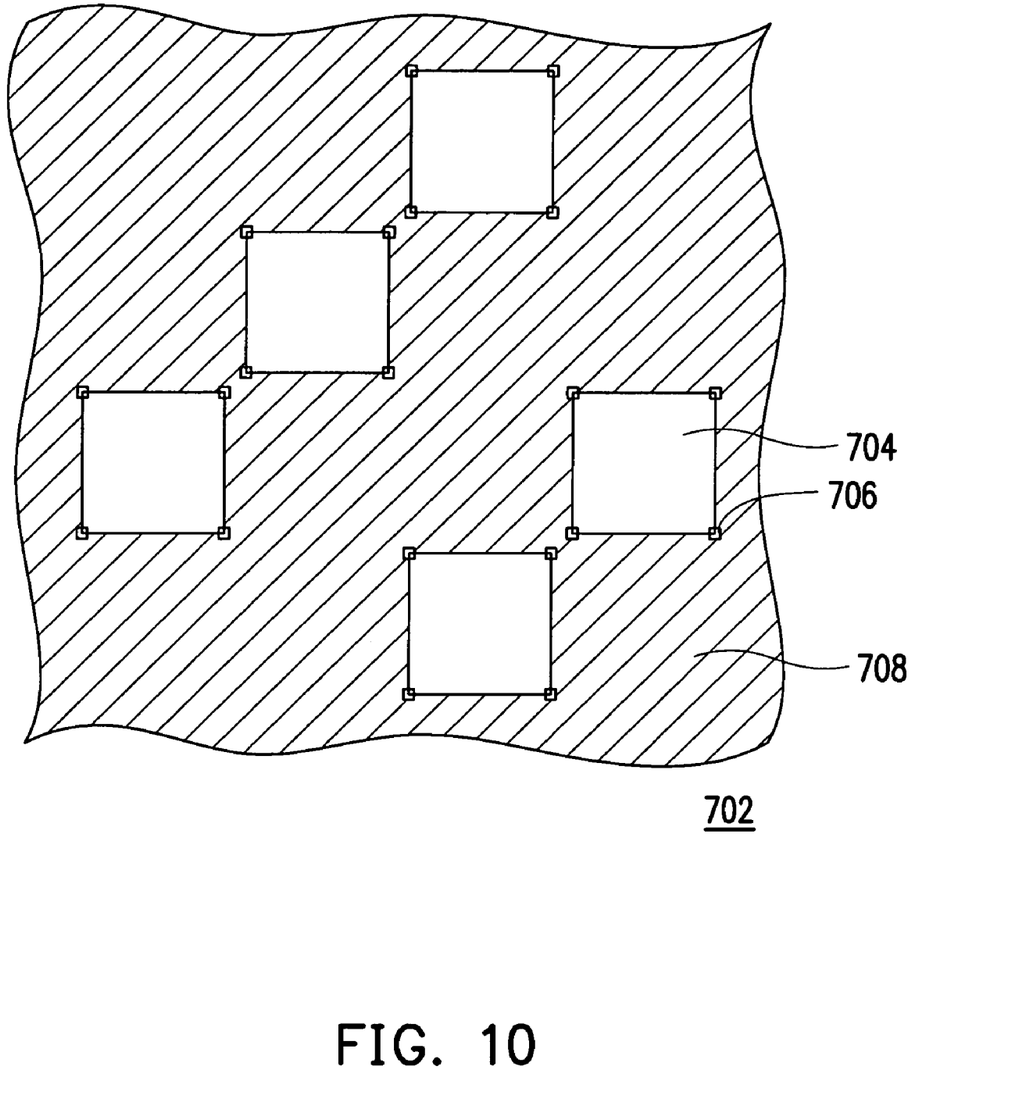

FIGS. 7A-7D are cross-sectional views along the line A-A' in FIG. 6. FIGS. 8-10 are top views, schematically illustrating the mask, according to an embodiment of the invention.

Figure 7A:
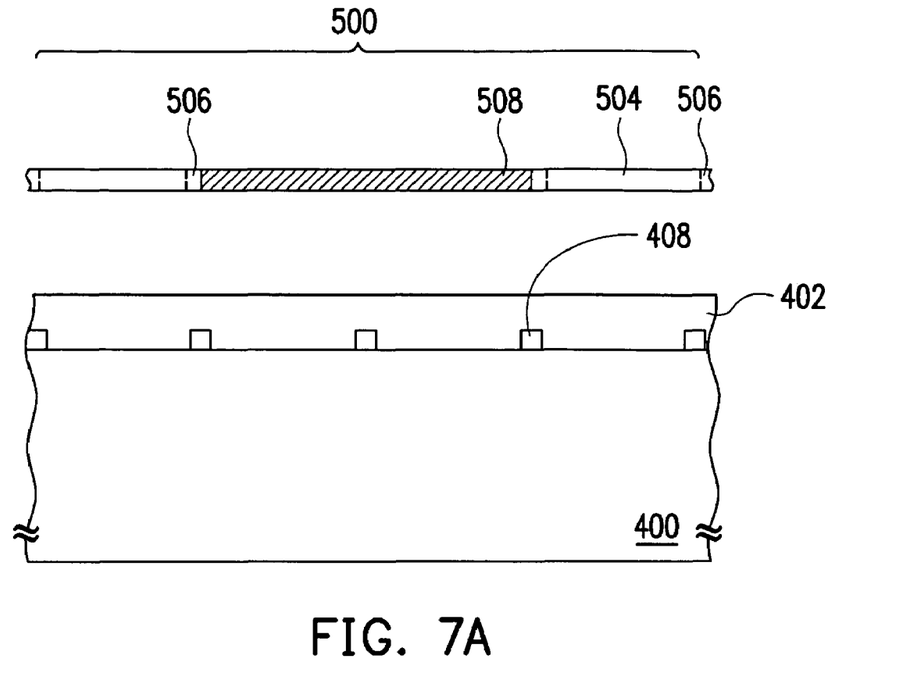
FIGS. 7A-7D are cross-sectional views along the line A-A' in FIG. 6.

Referring to FIG. 7A, a black matrix 408 can be formed over the substrate 400. The method is, for example, coating a non-transparent material layer, such as a black resin layer, over the substrate 400, and performing exposing and developing procedures for forming the black matrix 408. Then, a color photoresist 402 is coated over the substrate 400, and the mask 500 is used to perform the exposing process. Wherein, the color photoresist 402 is, for example, a red negative photoresist.

Referring to FIG. 6 and FIG. 8, the mask 500 includes a substrate 502, a mask pattern 504, a mending pattern 506, and a non-transparent pattern 508. A material for the substrate 502 is, for example, transparent glass. The mask pattern 504 is, for example, the transparent pattern in rectangular shape. A material for the non-transparent pattern 508 is, for example, Cr, used for forming the color filtering unit 402' on the color filter, indicated by R, as shown in FIG. 6. In addition, the mending pattern 506 is, for example, the serif disposed a side corner of the mask pattern 504 or disposed on the periphery of the mask pattern 504 on the substrate 502. In another embodiment, the mending pattern 506 can be, for example, an internal assisted line disposed within the mask pattern 504, such as the mending pattern 304 as can be seen in FIG. 4.

Figure 7B:
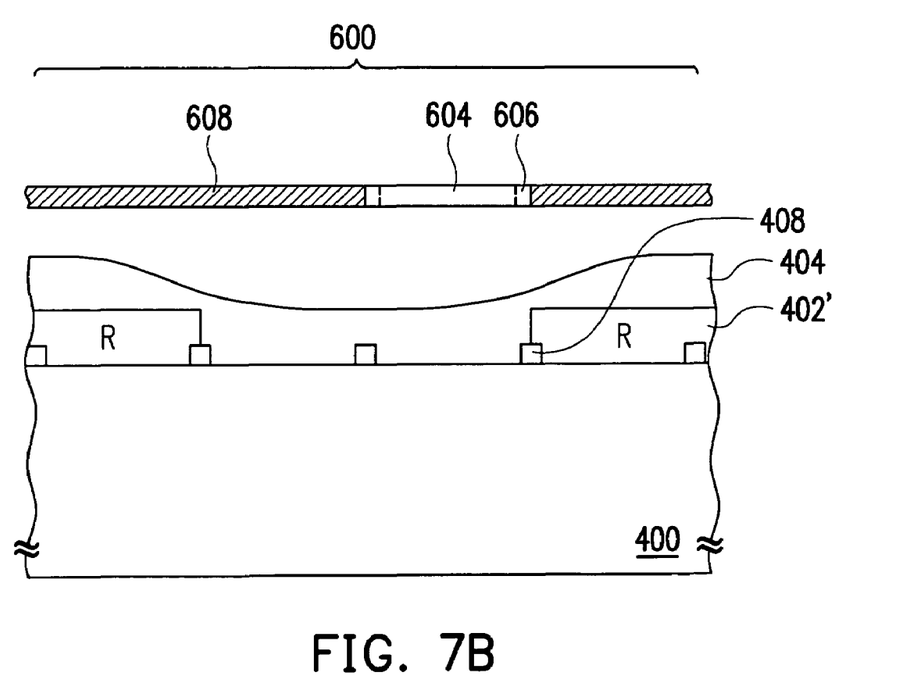

Referring to FIG. 7B, an image developing process is performed, so as to transformed the color photoresist 402 into the color filtering unit 402'. Then, another color photoresist layer 404 is coated over the substrate 400, and the mask 600 is used to perform a light exposure process. Wherein, the color photoresist 404 is for example a green negative photoresist.

Referring to FIG. 6 and 9, the foregoing mask 600 includes a substrate 602, a mask pattern 604, a mending pattern 606, and a non-transparent pattern 608. A material for the substrate 602 is, for example, transparent glass. The mask pattern 604 is, for example, the transparent pattern in rectangular shape. A material for the non-transparent pattern 608 is, for example, Cr, used for forming the color filtering unit 404' on the color filter, indicated by G, as shown in FIG. 6. In addition, the mending pattern 606 is, for example, the serif disposed a side corner of the mask pattern 604 or disposed on the periphery of the mask pattern 604 on the substrate 602. In another embodiment, the mending pattern 606 can be, for example, an internal assisted line disposed within the mask pattern 604, such as the mending pattern 304 as can be seen in FIG. 4.

Figure 7C:
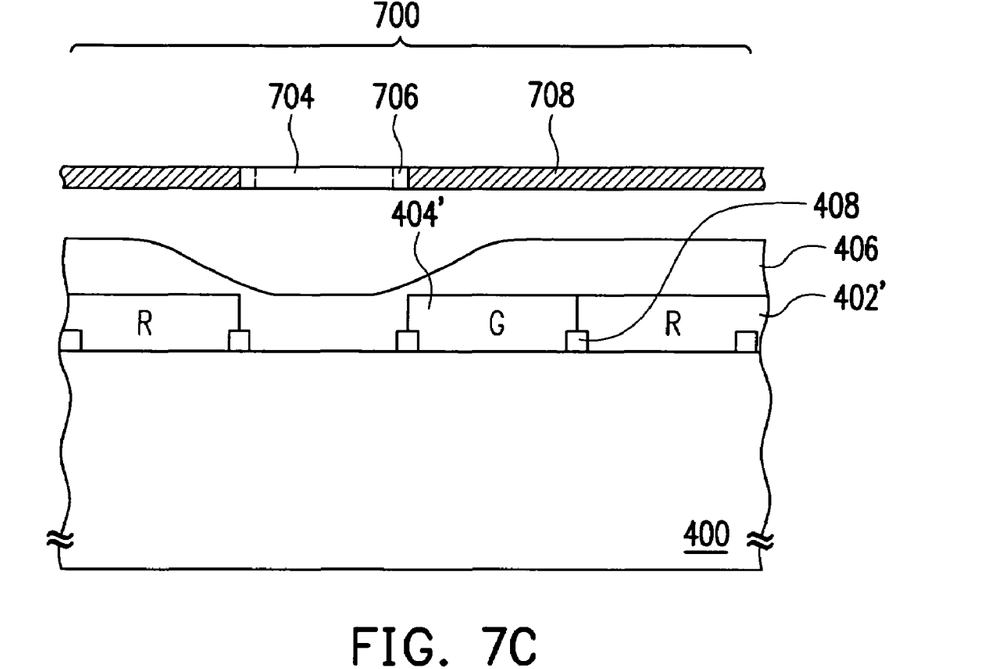

Referring to FIG. 7C, an image developing process is performed, so as to transformed the color photoresist 404 into the color filtering unit 404'. Then, another color photoresist layer 406 is coated over the substrate 400, and the mask 700 is used to perform a light exposure process. Wherein, the color photoresist 604 is for example a blue negative photoresist.

Referring to FIG. 6 and 10, the foregoing mask 700 includes a substrate 702, a mask pattern 704, a mending pattern 706, and a non-transparent pattern 708. A material for the substrate 702 is, for example, transparent glass. The mask pattern 704 is, for example, the transparent pattern in rectangular shape. A material for the non-transparent pattern 708 is, for example, Cr, used for forming the color filtering unit 406' on the color filter, indicated by B, as shown in FIG. 6. In addition, the mending pattern 706 is, for example, the serif disposed a side corner of the mask pattern 604 or disposed on the periphery of the mask pattern 704 on the substrate 702. In another embodiment, the mending pattern 706 can be, for example, an internal assisted line disposed within the mask pattern 704, such as the mending pattern 304 as can be seen in FIG. 4.

Figure 7D:
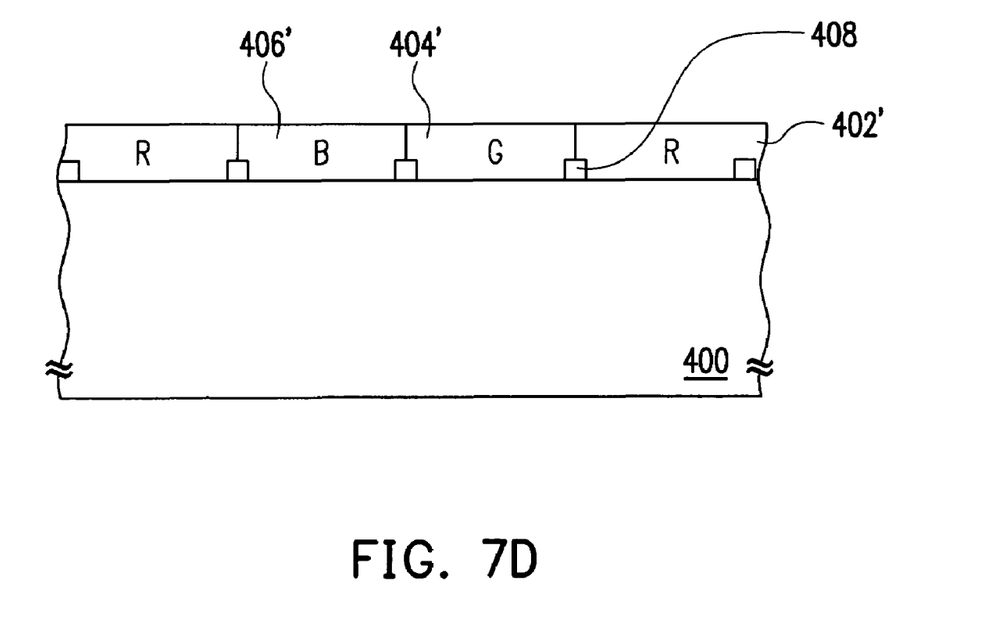

Referring to FIG. 7D, an image developing process is performed, so as to transformed the color photoresist 406 into the color filtering unit 406'. Since the masks 500, 600, and 700 respectively have the mending patterns 506, 606, and 706, the optical proximity effect can be effectively reduced. In photolithography process, it is very helpful to precisely transfer the pattern. As a result, there is no gap between the color filter 402', 404', and 406' and the light leaking phenomenon occurring on the color filter can be effectively reduced.

Then, the subsequent fabrication process to accomplish the color filter should be known by the ordinary skilled artisans and the description is omitted.

In the foregoing method for fabricating the color filter, the color filter unit 402', 404', and 406' are just used as the example for descriptions, and the invention is not limited by them. In another aspect, the arrangement of the mask patterns 504, 604, and 704 respectively on the masks 500, 600, and 700 can be changed in accordance with the different arrangement of the color filtering units, such as mosaic manner, stripe manner, four-pixel arrangement, or triangle arrangement. For the persons ordinarily skilled in the art can properly adjust the formation sequence of the color filtering units and the mask pattern, according to the actual designing requirement.

The optical proximity correction mask of the invention is used, so that the optical proximity effect can be significantly reduced. As a result, in fabricating the color filter by using the mask, the light leaking region between the color filtering units 402', 404' and 406' can be significantly eliminated. The phenomenon of light leaking is effectively reduced.

The invention at least has the advantages as follows.

1. By using the optical proximity correction mask of the invention, the optical proximity effect can be effectively reduced and the space resolution in photolithographic process can be improved, so as to more precisely transfer the pattern.

2. In the method for fabricating the color filtering unit of the invention, since the light leaking region is basically not existing between the color filtering units. The phenomenon of light leaking can be reduced, and the displaying quality can be improved.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. An optical proximity correction mask, suitable for use in fabricating a color filter having a transferred pattern, comprising:

a substrate;

a mask pattern, disposed over the substrate, wherein the mask pattern and the transferred pattern, being transferred to the color filter, are not matched and cause a light leaking region; and a mending pattern, disposed on a location corresponding to the light leaking region, wherein the mending pattern is an internal assisted line disposed within the mask pattern, at a peripheral region of the mask pattern on the substrate.

2. The mask of claim 1, wherein the mask pattern comprises a rectangular shape.

3. The mask of claim 1, wherein a material of the substrate comprises transparent glass.

4. A method for fabricating a color filter, suitable being on a display region of a substrate, the method comprising:

coating a first-color photoresist over the substrate;

performing a first exposure process on the photoresist by using a first mask, wherein the first mask comprises:
- a first substrate;
- a first mask pattern, disposed over the first substrate, wherein the first mask pattern and a first transferred pattern, being transferred to the first-color photoresist, are not matched and cause a first light leaking region in the color filter; and
- a first mending pattern, disposed over the first substrate at a periphery of the first mask pattern and corresponds to the first light leaking region;

performing a first developing process on the first-color photoresist to form a plurality of first-color filtering units;

coating a second-color photoresist over the substrate;

performing a second exposure process on the second-color photoresist by using a second mask, wherein the second mask comprises:
- a second substrate;
- a second mask pattern, disposed over the second substrate, wherein the second mask pattern and a second transferred pattern, being transferred to the second-color photoresist, are not matched and cause a second light leaking region in the color filter; and
- a second mending pattern, disposed over the second substrate at a periphery of the second mask pattern and corresponds to the second light leaking region;

performing a second developing process on the second-color photoresist to form a plurality of second-color filtering units;

coating a third-color photoresist over the substrate;

performing a third exposure process on the third-color photoresist by using a third mask, wherein the third mask comprises:
- a third substrate;
- a third mask pattern, disposed over the third substrate, wherein the third mask pattern and a third transferred pattern, being transferred to the third-color photoresist, are not matched and cause a third light leaking region in the color filter; and
- a third mending pattern, disposed over the third substrate at a periphery of the third mask pattern and corresponds to the third light leaking region; and performing a third developing process on the third-color photoresist to form a plurality of third-color filtering units, wherein the first, second, and third mending patterns are internal assisted lines respectively disposed within the first, second, third mask patterns.

5. The method of claim 4, wherein the first mask pattern, the second mask pattern, and the third mask pattern comprise a rectangular shape.

6. The method of claim 4, wherein first-color filtering units, the second-color filtering units, and the third-color filtering units are arranged by a form of mosaic, strip, four-pixel arrangement, or triangle.

7. The method of claim 4, wherein materials of the first-color photoresist, the second-color photoresist, and the third-color photoresist are respectively a red photoresist, a green photoresist, and a blue photoresist, which are different from each other.

8. The method of claim 7, wherein the red photoresist, the green photoresist, and the blue photoresist are negative photoresists.

9. The method of claim 4, wherein before coating the first-color photoresist over the substrate, further comprising forming a black matrix over the substrate.

10. The method of claim 4, wherein the substrate comprises a substrate with thin film transistor (TFT) army.

11. The method of claim 4, wherein a material of the substrate comprises transparent glass.

12. The method of claim 4, wherein materials for the first substrate, the second substrate, and the third substrate comprise transparent glass.

* * * * *